United States Patent
Nakahata et al.

[11] Patent Number: 5,401,544
[45] Date of Patent: Mar. 28, 1995

[54] METHOD FOR MANUFACTURING A SURFACE ACOUSTIC WAVE DEVICE

[75] Inventors: Hideaki Nakahata; Shinichi Shikata; Akihiro Hachigo; Naoji Fujimori, all of Hyogo, Japan

[73] Assignee: Sumitomo Electric Industries, Ltd., Osaka, Japan

[21] Appl. No.: 109,394

[22] Filed: Aug. 19, 1993

Related U.S. Application Data

[62] Division of Ser. No. 946,184, Sep. 16, 1992, abandoned.

[30] Foreign Application Priority Data

Sep. 25, 1991 [JP] Japan ............... 3-245644

[51] Int. Cl.⁶ ............... H01L 41/08; B05D 3/06; C23C 16/20
[52] U.S. Cl. ............... 427/585; 427/100; 427/124; 427/125; 427/250; 310/313 A; 310/313 R; 310/313 B
[58] Field of Search ........... 427/100, 124, 125, 419.2, 427/585, 250; 156/643; 310/313 A, 313 R, 313 B

[56] References Cited

U.S. PATENT DOCUMENTS

| | | |
|---|---|---|
| 4,330,767 | 5/1982 | Miyajima et al. ............... 333/150 |
| 4,638,536 | 1/1987 | Vig . | 
| 4,874,460 | 10/1989 | Nakagawa et al. . |
| 4,933,588 | 6/1990 | Greer ............... 310/313 R X |
| 4,952,832 | 8/1990 | Imai et al. ............... 310/313 A |
| 5,010,270 | 4/1991 | Greer ............... 310/313 R X |
| 5,061,870 | 10/1991 | Ieki et al. ............... 310/313 A |
| 5,152,864 | 10/1992 | Ieki et al. ............... 156/610 |
| 5,160,869 | 11/1992 | Nakahata et al. ............... 310/313 A |
| 5,162,690 | 11/1992 | Ieki et al. ............... 310/313 R |

FOREIGN PATENT DOCUMENTS

| | | |
|---|---|---|
| 0407163 | 1/1991 | European Pat. Off. . |
| 56-169771 | 4/1982 | Japan . |
| 64-62911 | 3/1989 | Japan . |

OTHER PUBLICATIONS

Blauner et al, "Focused ion beam fabrication of submicron gold structures", J. Vac. Sci. Technol. B7(4) Jul./Aug. 1989, pp. 609–617.

Dubner et al, "The role of the ion–solid interaction in ion–beam–induced deposition of gold", J. Appl. Phys. 70(2) Jul. 1991, pp. 665–673.

Primary Examiner—Roy V. King
Attorney, Agent, or Firm—W. G. Fasse; W. F. Fasse

[57] ABSTRACT

A surface acoustic wave device which can operate at a higher frequency range is produced by irradiation with a focused ion beam to produce a narrower electrode width and narrower spacing width between neighboring electrodes in contact with a piezoelectric body, without degrading the reliability of the device. The surface acoustic wave device includes a piezoelectric body 3 and interdigital electrodes 2a and 2b in close contact with the piezoelectric body 3 and formed by using the focused ion beam. In order to increase the frequency of the device, the piezoelectric body 3 may be formed on a substrate 1, for example of diamond.

9 Claims, 3 Drawing Sheets

METHOD FOR MANUFACTURING A SURFACE ACOUSTIC WAVE DEVICE

This application is a divisional of application Ser. No. 07/946,184, filed on Sept. 16, 1992, now abandoned.

FIELD OF THE INVENTION

The present invention relates to a method for manufacturing a surface acoustic wave device which can be used as a high frequency filter, for example.

BACKGROUND INFORMATION

A surface acoustic wave device, which is an electro-mechanical transducer device utilizing surface waves propagated on the surface of an elastic body, has a general structure shown in FIG. 1, for example. In such a surface acoustic wave device 30, a piezoelectric phenomenon which is caused by a piezoelectric material 31 is utilized for generating surface waves. When an electric signal is applied to one of the interdigital electrodes 32 provided on the piezoelectric body 31, strains are generated in the piezoelectric body 31, which cause surface acoustic waves propagated on the piezoelectric body 31 converting said waves into an electric signal available at the other one of the interdigital electrodes 33. The term "interdigital" as used herein means that the electrodes forming a pair have finger-like extensions that intermesh with each other as shown in FIG. 1. The frequency characteristics of a device have the bandpass characteristics with the frequency $f_0$ at the center of the band, which frequency is determined as $f_0 = v/\lambda_0$ where $\lambda_0$ represents the period of the electrodes of the interdigital electrodes and v represents the velocity of the surface acoustic waves.

The surface acoustic wave device can be used as a filter, a delay line, an oscillator, a resonator, a convolver, a correlator and so on. Especially, a surface acoustic wave filter has been practically used as an intermediate frequency filter in a television for a long time. Such devices are now being used as filters for VTR and various kinds of communication devices.

With respect to the above described surface acoustic wave device, a device which can be operated at a higher frequency range has been desired as a surface acoustic wave filter used in the field of mobile communication, for example. As shown by the above equation, if the period $\lambda_0$ of the electrodes is made smaller or if the velocity v of the surface waves is made higher, the frequency characteristics of the device would have a higher center frequency $f_0$. Japanese Patent Laying-Open No. 64-62911 commonly owned by the assignee of this application discloses a surface acoustic wave device in which a piezoelectric body is stacked on a diamond layer so as to increase the velocity v of the surface acoustic waves. The sound velocity in diamond is the highest compared to all materials known at present, and diamond is physically and chemically stable. Namely, diamond is a material suitable for increasing $f_0$ of the device with a high reliability.

Interdigital electrodes have been formed by photolithography. When a photolithography technique is employed, it is difficult to make the electrode width smaller than about 0.5 μm because of technical limits of photolithographic fine processing. The frequency $f_0$ of the device can be increased by using diamond as mentioned above, and it is necessary to reduce the electrode width to make the period $\lambda_0$ of the electrodes smaller, if a still higher frequency $f_0$ is desired.

SUMMARY OF THE INVENTION

It is an object of the present invention to provide a surface acoustic wave device which can operate at a higher frequency than heretofore with small size electrodes, while maintaining the reliability of the device.

According to one aspect, the present invention provides a surface acoustic wave device including a piezoelectric body and interdigital electrodes in close contact with the piezoelectric body, which device is characterized in that the interdigital electrodes are formed by a focused ion beam.

Electrolytic dissociated liquid metal is generally used as an ion source of the focused ion beam. The focused ion beam is utilized for ion implantation, ion beam etching, ion beam lithography, ion beam modification, deposition and the like. Among these techniques, deposition and etching are specifically useful for forming interdigital electrodes.

The interdigital electrodes can be formed, for example, by a deposition performed by using a focused ion beam, whereby gas molecules absorbed in the surface of the substrate are decomposed by the ion beam irradiation, and by depositing thus produced nonvolatile dissociated atoms. In this method, dimethylgoldhexafluoroacetylacetonate (DMGFA), for example, is used as the raw material gas, and an irradiating Ar beam forms an ion source: Ar, an Au film is formed as the electrodes. In the method using DMGFA an ion beam of Ga or an Au-Ga ion beam, an He ion beam or an ion beam of Au, Au-Ga, Au-Be-Si or Au-Si may be used instead of the Ar ion beam. Among the aforementioned beams, an Ar beam or Au beam with 90% or more of Au is more preferred for deposition.

During deposition using a focused ion beam, trimethylaluminum (TMA) may be used as the raw material gas. In this case, by irradiating the raw material gas with an Ar beam, Ga beam, He beam or Au beam interdigital electrodes of Al can be formed. As described above, by irradiating a raw material gas with a focused ion beam consisting of an organometallic compound and depositing the produced metal, interdigital electrodes formed of thin metal film can be provided.

Further, when etching with the focused ion beam by directing the focused ion beam onto a conductive layer in a reaction gas atmosphere of $Cl_2$, $BCl_3$, $CHF_3$, $XeCl_2$ or $XeF_2$ or the like of about 10 mTorr, the conductive layer is etched to provide the interdigital electrodes. From the view point of preventing corrosion of the reaction chamber, $XeF_2$ or $CHF_3$ is preferably used as the reaction gas. An Au-beam or a Ge-beam can preferably be used as the focused ion beam for etching. The Au-beam is more preferred as it has a higher etching rate.

The beam diameter of the aforementioned focused ion beam can be made to be several ten nm at the smallest. Therefore, a very small structure in the order of a quarter micron can be formed by using the focused ion beam. Compared with the non-focused ion beam, current density of the focused ion beam is higher and the beam diameter is smaller. Therefore, when the gas is irradiated by the ion beam, a higher activation rate can be obtained, and the formation of the electrodes with a higher precision is possible. Therefore, the present device does have interdigital electrodes formed with a line and spacing width of 0.5 μm at the largest, the formation of which is difficult by conventional techniques. In the device in accordance with the present invention, the interdigital electrodes can have a line and spacing width of about 0.1 to 0.5 μm and, preferably, the line and spacing width is within 0.2 to 0.35 μm, with a high reliability.

In the present invention, the piezoelectric body may include, as the main component, one or more compounds selected from the group consisting of ZnO, AlN, Pb (Zr, Ti)O$_3$, (Pb, La)(Zr, Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS. The piezoelectric body may be a single crystal or a polycrystal. However, a single crystal in which the surface waves scatter less, is preferred in order to use the device at a higher frequency range. Among these materials, the piezoelectric body of ZnO, AlN and Pb (Zr, Ti)O$_3$ can be formed by a CVD method or by sputtering.

In the device in accordance with the present invention, a material in which the acoustic waves propagate at higher velocity than in the piezoelectric body for example, diamond, diamond-like carbon, boron nitride, sapphire and the like may be provided in close contact with or adhered to the piezoelectric body. The diamond includes natural single crystal diamond, single crystal diamond artificially synthesized under very high pressure and polycrystalline diamond vapor deposited by CVD, ion beam deposition or by sputtering. The diamond-like carbon is also called i-carbon, which is a composition including carbon and hydrogen. The diamond-like carbon film is amorphous and electrically an insulator. The diamond-like carbon film transmits light and has a hardness of about 1000–5000 (Hv). The diamond-like carbon film is synthesized by a CVD vapor phase process, ion beam, vapor deposition or sputtering.

The present invention provides a method of manufacturing a surface acoustic wave device including a piezoelectric body and interdigital electrodes in close contact with the piezoelectric body, which method is characterized in that the interdigital electrodes are formed by using a focused ion beam. The interdigital electrodes can be formed either by the above mentioned focused ion beam deposition or by focused ion beam etching for example.

In the manufacturing method of the present invention, interdigital electrodes are formed on a prepared substrate and a piezoelectric body can be formed thereon. The substrate may be made of a semiconductor such as Si, diamond, sapphire, boron nitride or the like. When a semiconductor substrate of Si or the like is used, a thin film of diamond, diamond-like carbon, sapphire or boron nitride may be formed on the substrate, and the interdigital electrodes are then formed on the thin film. The thin film may be formed by CVD, ion beam deposition or sputtering. Alternatively, the interdigital electrodes may be formed on a piezoelectric body formed on a substrate.

Since the interdigital electrodes are formed by directing a focused ion beam onto the surface of the acoustic wave device, the electrode width can be in the order of one quarter of a micron. The precision of the electrode width is high. Therefore, the device of the present invention can operate at a higher frequency range than the prior art, and in addition the device produced according to the invention has a superior reliability. Further, formation of the electrodes by the focused ion beam can be effected without a mask. More specifically, in the present device the interdigital electrodes can be directly formed without the step of forming a resist pattern, which significantly reduces the number of manufacturing steps. Further, the electrode formation by the focused ion beam can be controlled in accordance with information stored in a computer. Therefore, a surface acoustic wave devices with custom made electrodes can be easily provided. Further, the present method is quite suitable for producing various types of devices, each type in small numbers. Moreover, according to the invention the electrodes can be made of metals which can not be finely processed by a conventional method, such as uses Au, by means of an unfocused ion beam. However, by employing Au for the electrodes, a device having high reliability can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A. 2B and 2C are cross sectional views schematically showing the steps of manufacturing a surface acoustic wave device in accordance with one embodiment of the present invention, in which

FIGS. 3A, 3B and 3C are cross sectional views schematically showing the steps of manufacturing the surface acoustic wave device in accordance with another embodiment of the present invention, in which FIG. 3C shows the finished device.

DESCRIPTION OF THE PREFERRED EMBODIMENTS

Embodiment 1

A high frequency filter was manufactured in accordance with the present invention in the following manner.

Figure 1:
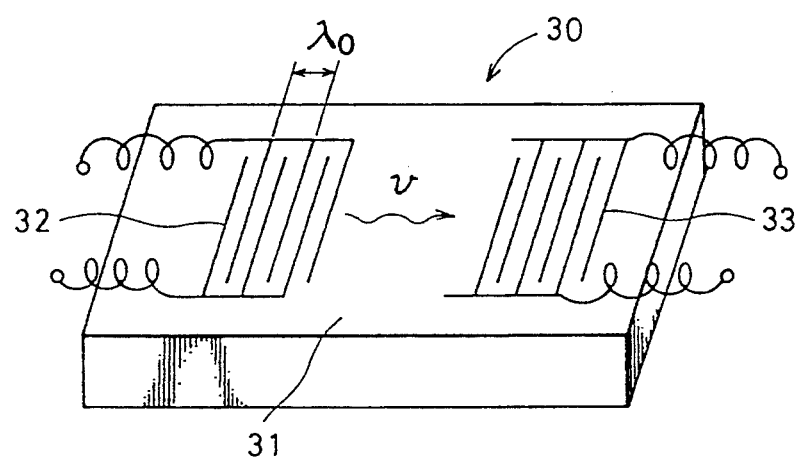
FIG. 1 is a plan view showing the general structure of a surface acoustic wave device.
Figure 2A:
Figure 2B:
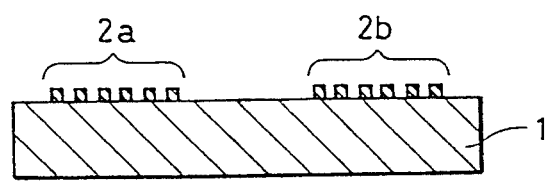
Figure 2C:
FIG. 2C shows the finished device.
Figure 3A:
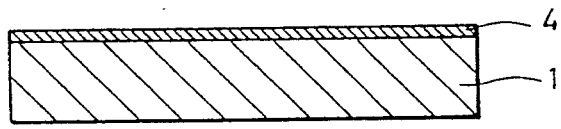
Figure 3B:
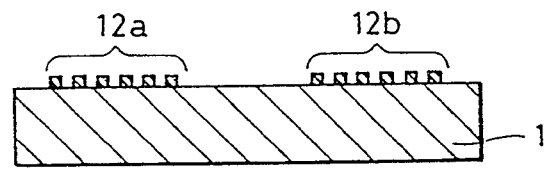
Figure 3C:

Referring to FIG. 2A, a substrate 1 of a single crystal diamond was prepared. The substrate was placed in a focused ion beam apparatus, and dimethylgoldhexafluoroacetylacetonate (DMGFA) as a source gas was introduced into the substrate 1. Thereafter, an Ar beam of 1 keV was used to irradiate on the substrate 1, and by beam scanning, interdigital electrodes 2a and 2b of Au were formed with a line and spacing width of 0.3 μm (FIG. 2B). Thereafter, the substrate on which the electrodes were formed was moved from the focused ion beam apparatus to a magnetron sputtering device, and an ZnO piezoelectric body 3 was deposited on the substrate 1 (FIG. 2C) by magnetron sputtering in which a ZnO polycrystalline body was sputtered with a mixed gas of Ar:O$_2$=1:1 at the sputter power of 100 W and at a substrate temperature of 380° C. The resonance frequency of the high frequency filter formed in the above described method was 8 GHz.

In the above described embodiment, Ga beam (ion source: Au-Ga or Ga), He beam (ion source: He) or Au beam (ion source: Au-Ga, Au-Be-Si or Au-Si) may be used instead of the Ar beam. Further, interdigital electrodes of Al can be formed by using trimethylaluminum (TMA) instead of DMGFA in the above described embodiment.

When using Au as shown in the above described embodiment, it is possible to provide a surface acoustic wave device which maintains superior reliability without an electron migration even though the electron line width and the spacing width between neighboring electrodes is, for example, 0.3 μm.

Embodiment 2

An Al layer 4 was vapor-deposited to the thickness of about 700 μm by ohmic-resistance heating on a substrate 1 of single crystal diamond, as shown in FIG. 2(a). Thereafter, the substrate was placed in a reaction chamber of the focused ion beam apparatus, and an Au+ ion beam with the ion source of Au-Be-Si was irradiated in XeF$_2$ of 20 mTorr. Etching was done by irradiating the Al layer with the Au+ ion beam by scanning the Al layer 4 with the beam. As a result, interdigital electrodes 12a and 12b of Al were formed which have an electrode and spacing width of 0.3 μm (FIG. 2(b)). Thereafter, a ZnO piezoelectric body 3 was deposited in a similar manner as in embodiment 1 (FIG. 2(c)). The resonance frequency of the high frequency filter formed by the above described method was about 8 GHz.

For comparison, interdigital electrodes of Al were formed with an electrode width and a spacing width of 0.6 μm by conventional photolithography, a reactive ion etching was performed on a diamond substrate, and a ZnO piezoelectric body was deposited to provide a high frequency filter. The resonance frequency of this filter was 4 GHz.

In the above embodiment 2, Cl$_2$, BCl$_3$, CHF$_3$ or XeCl$_2$ may be used in place of XeF$_2$. In addition, a Ga ion beam may be used instead of the Au+ beam.

From the above embodiments, it has been shown that the present interdigital electrodes have a small electrode width and a small spacing between neighboring electrodes which could not be obtained in the prior art. As a result the device produced in accordance with the present invention can operate at a higher frequency range. Further, by the present invention, interdigital electrodes having desired shapes can be formed without forming resist films.

The present invention enables formation of interdigital electrodes by a smaller number of manufacturing steps as compared with the prior art.

Figure 4:
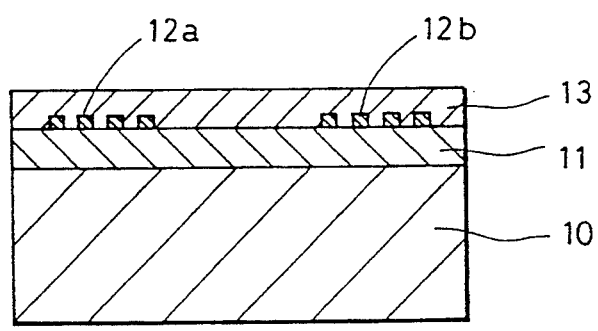
FIG. 4 is a cross sectional view schematically showing a further specific example in accordance with the present invention.

Although a diamond crystal was used as a substrate in the above described embodiments, substrates other than diamond may be used. As shown in FIG. 4, for example, silicon may be used as a substrate 10, a diamond layer 11 may be formed by the CVD method thereon and the interdigital electrodes 12a and 12b and the piezoelectric body 13 may be stacked thereon. Diamond-like carbon film, sapphire or boron nitride may be used instead of diamond.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a surface acoustic wave device, comprising the steps of:
   (a) preparing a substrate essentially made of at least one of diamond, sapphire and boron nitride;
   (b) irradiating a raw material gas consisting essentially of an organo-metallic compound containing aluminum with a focused ion beam to form an aluminum film on a surface of said substrate, said aluminum film an interdigital electrode having a line and spacing width of about 0.1 to 0.5 μm; and
   (c) forming a piezoelectric body in close contact with said interdigital electrode on said surface of said substrate.

2. The method of claim 1, wherein said organo-metallic compound is trimethylaluminum.

3. The method of claim 1, wherein said focused ion beam includes ions selected from the group consisting of Ar, Ga, He and AU.

4. A method for manufacturing a surface acoustic wave device, comprising the steps of:
   (a) preparing a thin film essentially made of at least one member selected from the group consisting of diamond, diamond-like carbon film, sapphire and boron nitride on a substrate;
   (b) irradiating a raw material gas consisting essentially of an organo-metallic compound containing aluminum with a focused ion beam to form an aluminum film on a surface of said thin film, said aluminum film forming an interdigital electrode having a line and spacing of about 0.1 to 0.5 μm; and
   (c) forming a piezoelectric body in close contact with said interdigital electrode on said surface of said thin film.

5. The method of claim 4, wherein said organo-metallic compound is trimethylaluminum.

6. The method of claim 4, wherein said focused ion beam includes ions selected from the group consisting of Ar, Ga, He and Au.

7. A method for manufacturing a surface acoustic wave device, comprising the steps of:
   (a) preparing a thin film essentially made of diamond on a substrate essentially made of silicon;
   (b) irradiating a raw material gas consisting essentially of an organo-metallic compound containing aluminum with a focused ion beam to form an aluminum film on a surface of said thin film, said aluminum film forming an interdigital electrode having a line and spacing width of about 0.1 to 0.5 μm; and
   (c) forming a piezoelectric body in close contact with said interdigital electrode on said surface of said thin film.

8. The method of claim 7, wherein said focused ion beam includes ions selected from the group consisting of Art Ga, Me and Au.

9. A method for manufacturing a surface acoustic wave device, comprising the steps of:
   (a) preparing a substrate essentially made of at least one of diamond, sapphire and boron nitride;
   (b) forming a piezoelectric body on a surface of said substrate; and
   (c) irradiating a raw material gas consisting essentially of an organo-metallic compound containing aluminum with a focused ion beam to form an aluminum film on a surface of said piezoelectric body, said aluminum film forming an interdigital electrode having a line and spacing width of about 0.1 to 0.5 μm.

* * * * *

UNITED STATES PATENT AND TRADEMARK OFFICE
CERTIFICATE OF CORRECTION

PATENT NO. : 5,401,544

DATED : March 28, 1995

INVENTOR(S) : Nakahata et al.

It is certified that error appears in the above-identified patent and that said Letters Patent is hereby corrected as shown below:

Col. 1, line 31, replace "the" by --a--.

Col. 2, line 30, after "," insert --whereby--;

Col. 3, line 21, after "body" insert --,--;
      line 23, after "like" insert --,--.

Col. 4, line 51, delete "on".

Claim 1, col. 6, claim line 9, after "film" insert --forming--.

Claim 3, col. 6, claim line 3, replace "AU" by --Au--.

Claim 8, col. 6, claim line 3, replace "Art" by --Ar,--;
                                                         replace "Me" by --He--.

Signed and Sealed this

Twenty-fifth Day of July, 1995

Attest:

BRUCE LEHMAN

*Attesting Officer*      *Commissioner of Patents and Trademarks*